(12) United States Patent
Yamamoto

(10) Patent No.: US 7,743,291 B2
(45) Date of Patent: Jun. 22, 2010

(54) SEMICONDUCTOR MEMORY DEVICE

(75) Inventor: Nobuo Yamamoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 264 days.

(21) Appl. No.: 11/825,240

(22) Filed: Jul. 5, 2007

(65) Prior Publication Data

US 2008/0008016 A1 Jan. 10, 2008

(30) Foreign Application Priority Data

Jul. 7, 2006 (JP) ............................. 2006-187694
Apr. 20, 2007 (JP) ............................. 2007-111436

(51) Int. Cl.
*G11C 29/00* (2006.01)

(52) U.S. Cl. ............................. 714/718; 714/5; 714/25; 714/42; 714/719; 714/724; 714/726; 714/727; 714/729; 714/742; 365/201

(58) Field of Classification Search ........................ None
See application file for complete search history.

(56) References Cited

U.S. PATENT DOCUMENTS

| | | | | |
|---|---|---|---|---|
| 5,406,566 A | * | 4/1995 | Obara | 714/719 |
| 5,787,097 A | * | 7/1998 | Roohparvar et al. | 714/722 |
| 5,848,074 A | * | 12/1998 | Maeno | 714/720 |
| 5,968,192 A | * | 10/1999 | Kornachuk et al. | 714/724 |
| 5,987,635 A | * | 11/1999 | Kishi et al. | 714/724 |
| 6,317,372 B1 | * | 11/2001 | Hayashi et al. | 365/201 |
| 6,574,762 B1 | * | 6/2003 | Karimi et al. | 714/727 |
| 7,230,861 B2 | * | 6/2007 | Inoue | 365/189.12 |
| 7,441,169 B2 | * | 10/2008 | Maeno | 714/726 |
| 2003/0106010 A1 | * | 6/2003 | Fujioka et al. | 714/763 |
| 2004/0250165 A1 | * | 12/2004 | Tanizaki | 714/30 |
| 2006/0156093 A1 | * | 7/2006 | Roohparvar | 714/718 |
| 2006/0156213 A1 | * | 7/2006 | Kikutake et al. | 714/800 |
| 2007/0234120 A1 | * | 10/2007 | Yoshida et al. | 714/30 |

FOREIGN PATENT DOCUMENTS

| | | |
|---|---|---|
| JP | 3-3189 | 1/1991 |
| JP | 6-139798 | 5/1994 |
| JP | 2000-182398 | 6/2000 |

* cited by examiner

*Primary Examiner*—John P Trimmings
(74) *Attorney, Agent, or Firm*—Scully, Scott, Murphy & Presser, P.C.

(57) ABSTRACT

A semiconductor memory device includes a memory cell array, a plurality of data input/output terminals, a plurality of signal paths for writing data supplied to the data input/output terminals to the memory cell array in parallel, a plurality of latch circuits temporarily holding the data on the signal paths, respectively, and a selector selectively supplying the data to the latch circuits from a test data terminal during a test operation. The data can be thereby supplied from the test data terminal to the latch circuits in parallel during the test operation. The number of terminals used at an operation test can be, therefore, greatly decreased.

6 Claims, 6 Drawing Sheets

SEMICONDUCTOR MEMORY DEVICE

TECHNICAL FIELD

The present invention generally relates to a semiconductor memory device, and particularly relates to a semiconductor memory device having a relatively large number of data input/output terminals.

BACKGROUND OF THE INVENTION

In a process of manufacturing a semiconductor memory device typified by a DRAM (Dynamic Random Access Memory), an operation test of every kind is often conducted in a wafer state. At the operation test, a defective address from which or to which data cannot be read or written is detected. The detected defective address is relieved by a redundant cell. Replacement of a defective cell by the redundant cell is performed mainly by fuse trimming.

Generally, the operation test in the wafer state is conducted for a plurality of chips in parallel using a probe card. Namely, clock terminals, address terminals, and command terminals of the test target chips are connected in common to one another within the probe card. By doing so, clock signals, address signals, and commands common to the chips are applied to the test target chips, in which state, read operation and write operation are actually performed to the chips. Therefore, the numbers of clock wirings, address wirings, and command wirings necessary within the probe card are equal to the numbers of clock terminals, address terminals, and command terminals of one chip, respectively. Due to this, the number of wirings on the probe card is relatively small despite the number of chips to be tested simultaneously.

On the other hand, it is necessary to independently provide data wirings at least for outputting data for respective chips. Therefore, data wirings cannot be connected in common within the probe card. As a result, the number of data wirings necessary on the probe card is equal to the total number of data input/output terminals of all the chips to be tested in parallel. Due to this, if the number of data input/output terminals per chip is large, that is, if chips large in data I/O width (the number of bits) is large are to be tested, quite many data wirings are necessary for the probe card. Besides, if the number of data input/output terminals per chip is large, the number of terminals necessary for the probe card increases accordingly.

However, the numbers of wirings and terminals that can be formed on the probe card are limited. For this reason, if chips each having relatively many data input/output width, e.g., 32 bits are to be tested, it is disadvantageously necessary to decrease the number of chips that can be tested in parallel. This eventually increases the operation test time per chip, disadvantageously resulting in an increase of manufacturing cost.

With regard to an operation test of a semiconductor memory device, a conventional technique disclosed in Japanese Patent Application Laid-open No. 2000-182398 has been known.

SUMMARY OF THE INVENTION

In this manner, conventional semiconductor memory devices have problems that the number of chips that can be tested in parallel is smaller and the manufacturing cost is higher if the number of data input/output terminals is larger.

It is therefore an object of the present invention to provide a semiconductor memory device capable of decreasing the numbers of wirings and terminals necessary for a probe card employed in an operation test.

The above and other objects of the present invention can be accomplished by a semiconductor memory device comprising:

a memory cell array;

a plurality of data input/output terminals;

a plurality of signal paths for writing data supplied to the plurality of data input/output terminals to the memory cell array in parallel;

a plurality of latch circuits temporarily holding the data on the plurality of signal paths, respectively; and a selector circuit selectively supplying the data to the plurality of latch circuits from a predetermined external terminal during a test operation.

According to the present invention, the data can be selectively supplied to the plurality of latch circuits from the predetermined external terminal during the test operation. Therefore, the number of terminals used at the operation test can be greatly decreased. Accordingly, the number of chips that can be tested in parallel increases, and the operation test time per chip can be thereby reduced. Besides, the latch circuits are provided on the respective signal paths, and the test data can be held in the latch circuits. It is, therefore, possible to continuously write a predetermined data pattern held in the plurality of latch circuits to different addresses. As a result, there is no need to input the test data from a tester every time, so that time for inputting data can be also reduced.

As explained above, according to the present invention, the number of terminals on the probe card employed at the operation test can be decreased. Therefore, even if the number of data input/output terminals is large, it is possible to secure many chips that can be tested in parallel. This can eventually reduce the operation test time per chip and, therefore, reduce the manufacturing cost.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
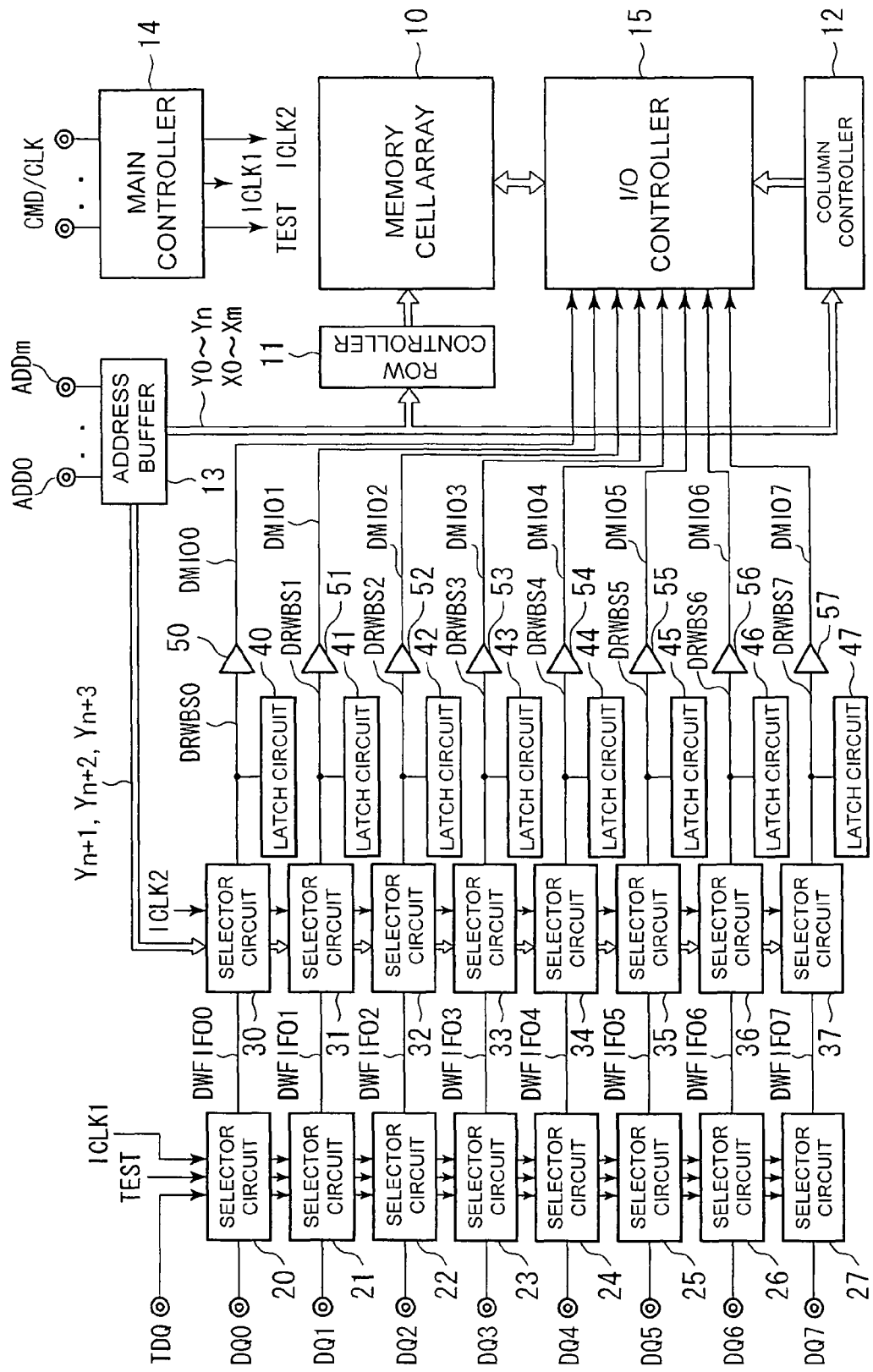
FIG. 1 is a schematic block diagram showing a configuration of a semiconductor memory device according to a preferred embodiment of the present invention.

FIG. 1 is a schematic block diagram showing a configuration of a semiconductor memory device according to a preferred embodiment of the present invention.

As shown in FIG. 1, the semiconductor memory device according to the present embodiment includes a memory cell array 10 as well as a row controller 11, a column controller 12, and an I/O controller 15 for access to the memory cell array 10. The memory cell array 10 is a region in which many memory cells are arranged in a matrix. If the semiconductor memory device according to the embodiment is, for example, a DRAM, many DRAM cells are arranged in a matrix.

The row controller 11 is a circuit for selecting a row to access the memory cell array 10, and configured to include a row decoder, a sub-word driver and the like. Row addresses X0 to Xm are supplied to the row controller 11 via an address buffer 13. The address buffer 13 is a circuit receiving address signals supplied from outside via m+1 address terminals ADD0 to ADDm.

The column controller 12 is a circuit for selecting a column to access the memory cell array 10, and configured to include a column decoder, a column switch and the like. Column addresses Y0 to Yn are supplied to the column controller 12 via the address buffer 13.

The I/O controller 15 is provided between the column controller 12 and the memory cell array 10. The I/O controller 15 is configured to include a read/write amplifier and a sense amplifier.

In the present embodiment, an address width (n+1) of the column addresses Y0 to Yn is set smaller than an address width (m+1) of the row addresses X0 to Xm, that is, m>n. The row addresses X0 to Xm and the column addresses Y0 to Yn different in address width are sequentially supplied to the address terminals ADD0 to ADDm. Specifically, the row addresses X0 to Xm are supplied first to the address terminals ADD0 to ADDm, and the column addresses Y0 to Yn are then supplied to the address terminals ADD0 to ADDn.

Accordingly, when the column addresses Y0 to Yn are supplied, the address terminals ADDn+1 to ADDm are unused terminals. As described later, according to the present embodiment, the unused address terminals are used during a test operation, whereby write data to be written in parallel can be input in serial.

As shown in FIG. 1, the semiconductor memory device according to the present embodiment includes not only the address terminals ADD0 to ADDm, but also data input/output terminals DQ0 to DQ7, a test data terminal TDQ, a command terminal CMD, a clock terminal CLK and the like. The command terminal CMD is a group of terminals including a RAS terminal, a CAS terminal, a WE terminal and the like. An overall operation to be performed by the semiconductor memory device is defined according to a combination of signals supplied via the terminals included in the command terminal CMD.

Signals supplied via the command terminal CMD and the clock terminal CLK are supplied to a main controller 14 shown in FIG. 1. The main controller 14 generates at least a test signal TEST and internal clocks ICLK1 and ICLK2 based on the signals supplied via the command terminal CMD and the clock terminal CLK. The test signal TEST is a signal that becomes low level during a normal operation and that becomes high level during a test operation.

The data input/output terminals DQ0 to DQ7 are terminals for inputting or outputting data of 8 bits to or from the memory cell array 10, and connected to the I/O controller 15 by eight independent signal paths, respectively. In this case, a data input/output width is 8 bits. However, if a plurality of sets of data input/output terminals DQ0 to DQ7 and the signal paths are provided, it is possible to increase the data input/output width. For example, if four sets of the data input/output terminals DQ0 to DQ7 and the signal paths are provided, the data input/output width becomes 32 bits.

As shown in FIG. 1, first selector circuits 20 to 27, second selector circuits 30 to 37, latch circuits 40 to 47, and driver circuits 50 to 57 are arranged on the respective signal paths connecting the data input/output terminals DQ0 to DQ7 to the I/O controller 15. To the selector circuits 20 to 27, write data from the corresponding input/output terminals DQ0 to DQ7 (hereinafter, the write data supplied to the input/output terminals DQ0 to DQ7 will be also denoted by "DQ0 to DQ7", respectively) are supplied, respectively, and write data from the test data terminal TDQ (hereinafter, the write data supplied to the test data terminal TDQ will be also denoted by "TDQ"), the test signal TEST, and the internal clock ICLK1 are supplied in common. To the selector circuits 30 to 37, write data DWFIFO0 to DWFIFO7 output from the corresponding first selector circuits 20 to 27 are supplied, respectively, and selection signals Yn+1 to Yn+3 and the internal clock ICLK2 are supplied in common.

Figure 2:
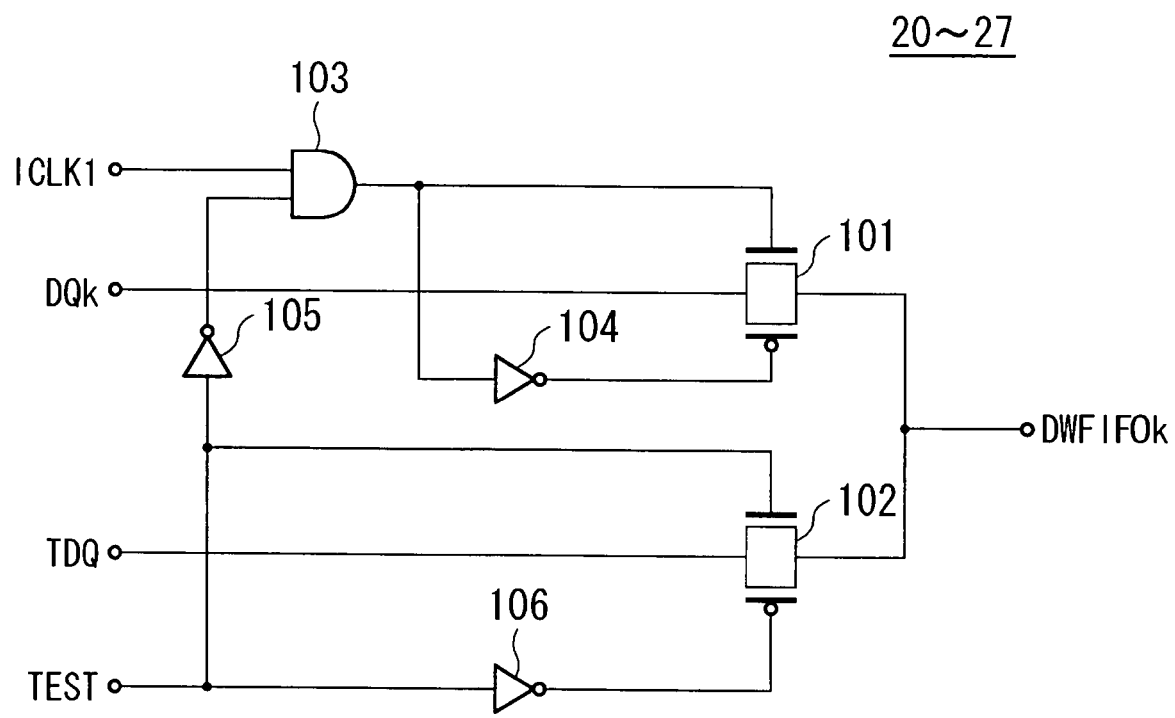
FIG. 2 is a circuit diagram of each of the selector circuits shown in FIG. 1.

FIG. 2 is a circuit diagram of each of the selector circuits 20 to 27.

As shown in FIG. 2, each of the selector circuits 20 to 27 includes a transfer gate 101 through which the write data DQk (where k=0 to 7) is passed, a transfer gate 102 through which the write data TDQ is passed, an AND gate 103, and inverters 104 to 106.

As explained above, during the normal operation, the test signal TEST is at low level, so that the transfer gate 102 is fixed into an OFF state. On the other hand, the transfer gate 101 is turned on in response to the internal clock ICLK1, so that the write data DQk supplied during the normal operation is passed through each of the selectors 20 to 27 synchronously with the clock ICLK1.

Meanwhile, during the test operation, the test signal TEST is at high level, so that the transfer gate 101 is turned off and the transfer gate 102 is turned on. As a result, during the test operation, the write data TDQ is passed through each of the selector circuits 20 to 27 irrespectively of the internal clock ICLK1.

The write data DWFIFOk passed through the selector circuits 20 to 27 is supplied to the next selector circuits 30 to 37, respectively.

Figure 3:
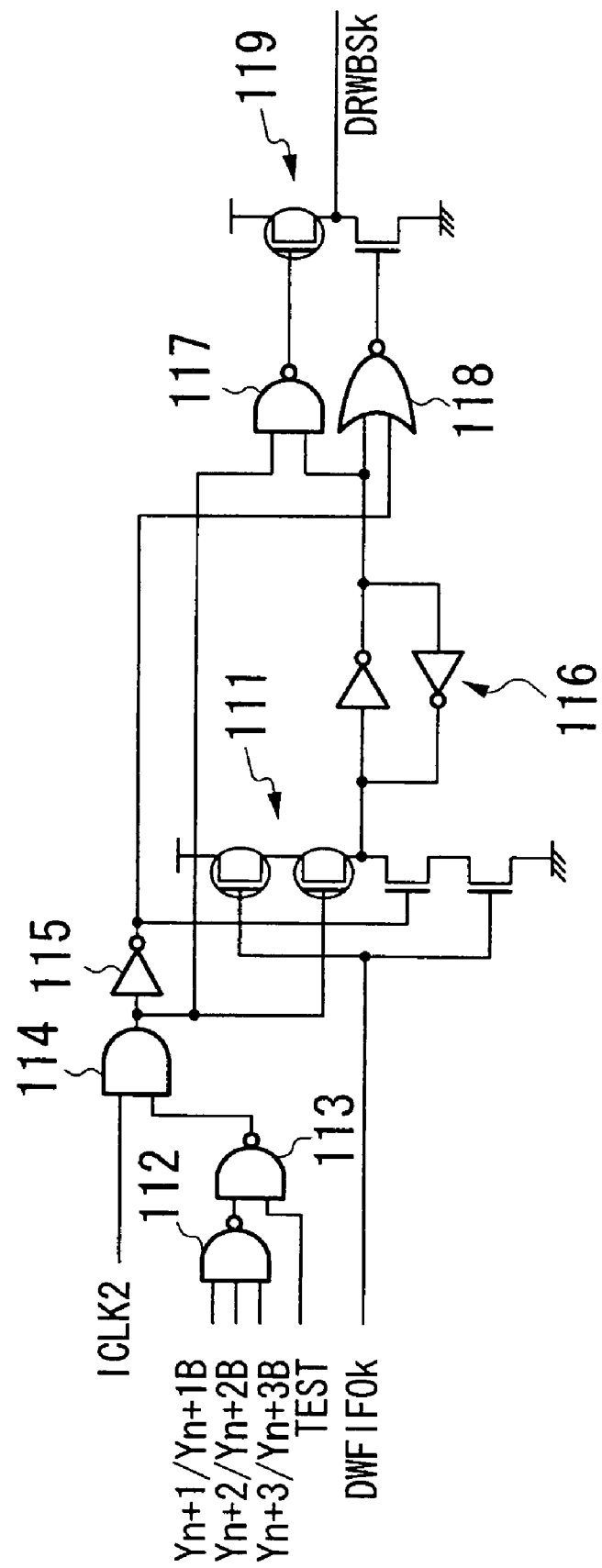
FIG. 3 is a circuit diagram of each of the selector circuits shown in FIG. 1.

FIG. 3 is a circuit diagram of each of the selector circuits 30 to 37.

As shown in FIG. 3, each of the selector circuits 30 to 37 includes a clocked inverter 111 receiving the write data DWFIFOk, NAND gates 112 and 113, an AND gate 114, and an inverter 115 that control an operation performed by the clocked inverter 111, a flip-flop 116 receiving an output of the clocked inverter 111, a NAND gate 117 and a NOR gate 118 receiving an output of the flip-flop 116, and an inverter 119 receiving outputs of the NAND gate 117 and the NOR gate 118.

Among the constituent elements of each of the selector circuits 30 to 37, the NAND gate 112 is a 3-input NAND gate. One of the selection signals Yn+1 and Yn+1B (inverted signal of the selection signal Yn+1), one of the selection signals Yn+2 and Yn+2B (inverted signal of the selection signal Yn+2), and one of the selection signals Yn+3 and Yn+3B (inverted signal of the selection signal Yn+3) are supplied to the three input terminals of the NAND gate 112, respectively. Combinations of the selection signals supplied to the NAND gate 112 differ among all the selector circuits 30 to 37. Due to this, an output of the NAND gate 112 included in one of the selector circuits 30 to 37 becomes low level according to a logic value of the selection signals of 3 bits (Yn+1, Yn+2, Yn+3). Outputs of the NAND gates 112 included in the other selector circuits 30 to 37 are all at high level.

Further, during the normal operation, the test signal TEST is at low level, so that an output of the NAND gate 113 is fixed to high level irrespectively of the logic value of the selection signals. Since the clocked inverter 111 is turned on in response to the internal clock ICLK2, the write data DWFIFOk supplied during the normal operation is (inverted by and) passed through the clocked inverter 111 synchronously with the internal clock ICLK2.

The signal passed through the clocked inverter 111 is supplied to the NAND gate 117 and the NOR gate 118 via the flip-flop 116. As shown in FIG. 3, an output of the AND gate 114 is supplied to the NAND gate 117, and an output of the inverter 115 is supplied to the NOR gate 118. Due to this, if the output of the AND gate 114 is at high level, the output of the flip-flop 116 is passed through via the inverter 119. However, if the output of the AND gate 114 is at low level, the output of the inverter 119 turns into a high impedance state.

Write data DRWBSk passed through the selector circuits 30 to 37 is supplied to the corresponding driver circuits 50 to 57, respectively.

On the other hand, during the test operation, the test signal TEST is at high level. Therefore, the write data DRWBSk is output synchronously with the internal clock ICLK2 only if the output of the NAND gate 112 is at low level. That is, only the write data DRWBSk corresponding to one of the selector circuits 30 to 37 is output based on the logic value of the selection signals. In each of the other selector circuits 30 to 37, the output of the NAND gate 113 is fixed to low level, so that the write data DWFIFOk cannot be passed through each of the selector circuits 30 to 37. In each of the other selector circuits 30 to 37, the output of the inverter 119 is fixed into the high impedance state.

Figure 4:
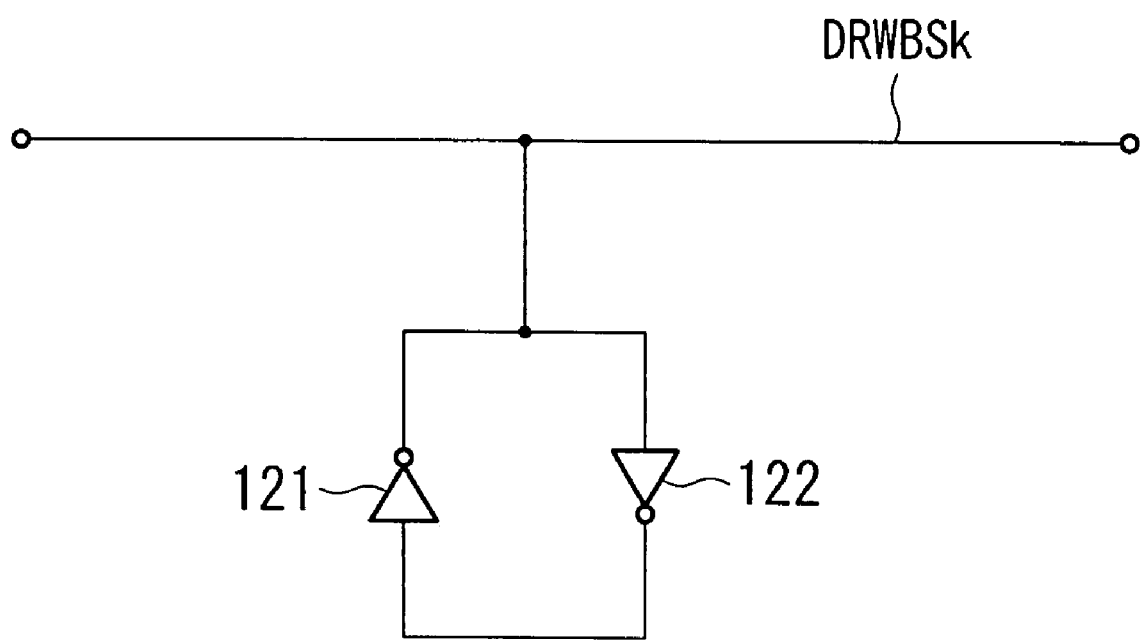
FIG. 4 is a circuit diagram of each of the latch circuits shown in FIG. 1.

As shown in FIG. 1, the latch circuits 40 to 47 temporarily holding the write data DRWBS0 to DRWBS7 on the signal paths connecting the selector circuits 30 to 37 to the driver circuits 50 to 57 are provided on the signal paths, respectively. FIG. 4 is a circuit diagram of each of the latch circuits 40 to 47, and each of the latch circuits 40 to 47 has a flip-flop configuration in which inverters 121 and 122 are circularly connected.

The write data DRWBS0 to DRWBS7 latched by the latch circuits 40 to 47 are supplied to the corresponding driver circuits 50 to 57, and then supplied to the I/O controller 15 via the respective signal paths. It is thereby possible to write the write data of 8 bits to the memory cell array 10 in parallel. As described above, a plurality of sets of the data input/output terminals DQ0 to DQ7 and the signal paths shown in FIG. 1 can be provided. If four sets of the data input/output terminals DQ0 to DQ7 and the signal paths are provided, for example, write data of 32 bits can be written to the memory cell array 10 in parallel.

The configuration of the semiconductor memory device according to the present embodiment has been described so far. An operation performed by the semiconductor memory device according to the embodiment will be explained next.

During a normal operation, the semiconductor memory device operates similarly to an ordinary DRAM. First, the row addresses X0 to Xm are input from the address terminals ADD0 to ADDm synchronously with an active command (ACT). Next, the column addresses Y0 to Yn are input from the address terminals ADD0 to ADDn synchronously with a write command (WRIT). Thereafter, if a plurality of desired write data is supplied to the data input/output terminals DQ0 to DQ7 at predetermined timing, respectively, the write data supplied to the data input/output terminals DQ0 to DQ7 is transmitted on the respective signal paths synchronously with the internal clocks ICLK1 and ICLK2 and written to the memory cell array 10 in parallel.

Figure 5:
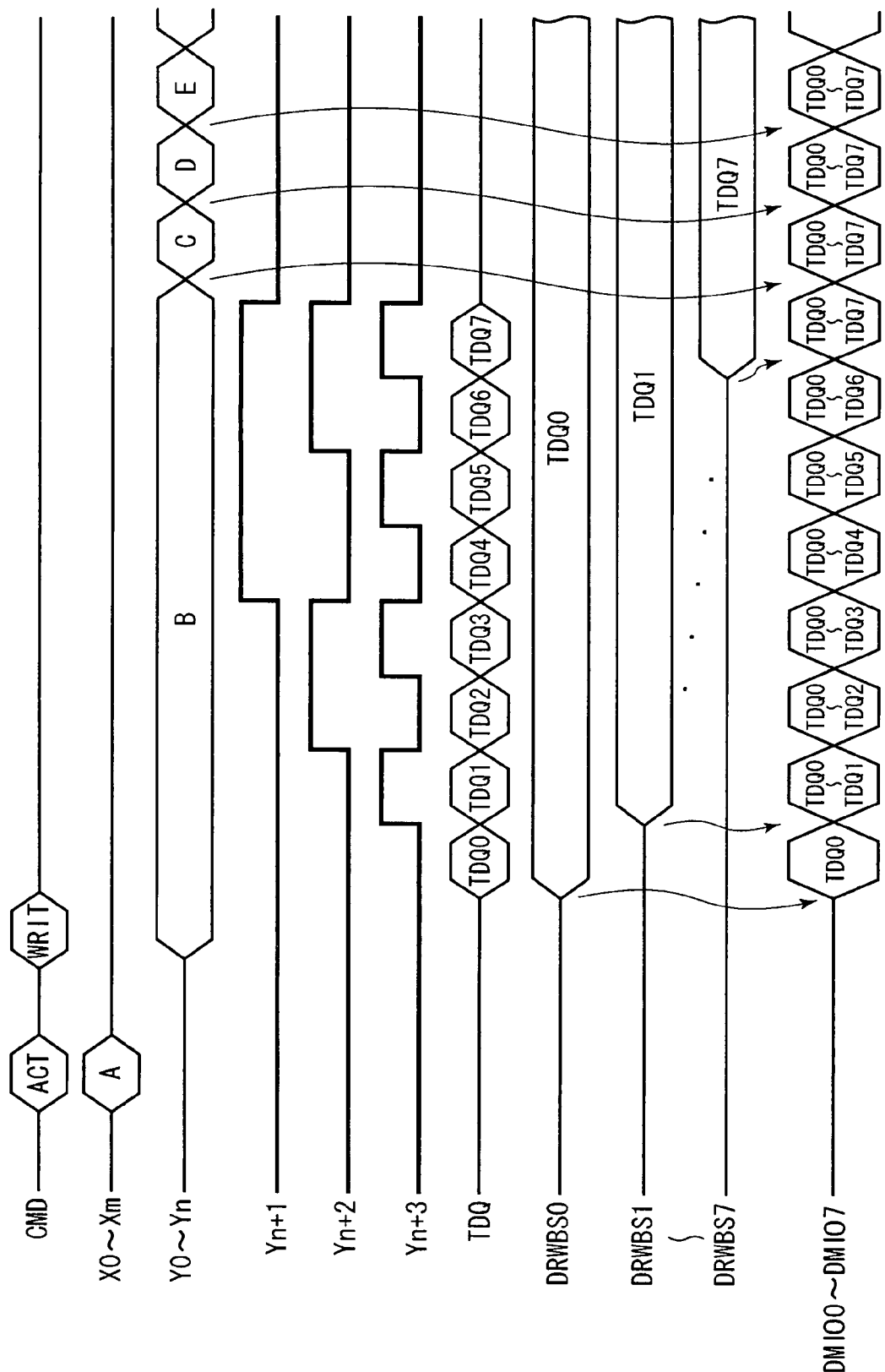
FIG. 5 is a timing chart showing the operation performed by the semiconductor memory device according to a preferred embodiment during the test operation.

FIG. 5 is a timing chart showing the operation performed by the semiconductor memory device according to the present embodiment during the test operation.

If the test operation is to be performed, the semiconductor memory device enters a test mode. Thereafter, as shown in FIG. 5, the row addresses X0 to Xm (=A) are input from the address terminals ADD0 to ADDm synchronously with the active command (ACT), and the column addresses Y0 to Yn (=B) are then input from the address terminals ADD0 to ADDn synchronously with the write command (WRIT). In this case, when the column addresses Y0 to Yn are input, the selection signals Yn+1 to Yn+3 are input via the address terminals ADDn+1 to ADDm that are not used during the normal operation. In the example shown in FIG. 5, all of the selection signal Yn+1 to Yn+3 are first set to low level (logic value: 000).

By so setting, the selector circuit 30, for example, is selected among the selector circuits 30 to 37. Due to this, if desired write data is supplied to the test data terminal TDQ at predetermined timing, then the write data is held in the latch circuit 40 corresponding to the selector circuit 30, and the write data is supplied to the memory cell array 10 via the driver circuit 50. Because outputs of the other selector circuits 31 to 37 are in high impedance states, values of the latch circuits 41 to 47 have no change. Accordingly, outputs of the driver circuits 51 to 57 remain values currently held in the respective latch circuits 41 to 47. In this manner, during the test operation, the write data supplied from the test data terminal TDQ can be selectively supplied to an arbitrary one of the latch circuits 40 to 47 based on the logic value of the selection signals Yn+1 to Yn+3.

Next, after incrementing the logic value of the selection signals Yn+1 to Yn+3 (logic value: 001), desired write data is supplied to the test data terminal TDQ. By doing so, the write data is held in the latch circuit 41, and supplied to the memory cell array 10 via the driver circuit 51, for example. At this time, the write data held in the latch circuit 40 is also written to the memory cell array 10 in parallel.

If a plurality of write data is thus sequentially supplied to the test data terminal TDQ while incrementing the logic value of the selection signals Yn+1 to Yn+3, desired write data is stored in the respective latch circuits 40 to 47. Namely, the write data can be supplied in series via the test data terminal TDQ without using the data input/output terminals DQ0 to DQ7. Accordingly, by providing, for example, four sets of the data input/output terminals DQ0 to DQ7 and the signal paths shown in FIG. 1, it is possible to write the write data of 32 bits to the memory cell array 10 in parallel using only four test data terminals TDQ without using 32 data input/output terminals ((DQ0 to DQ7)×4).

Thereafter, by changing the column addresses Y0 to Yn to C, D, E, . . . , the write data of 8 bits held in the latch circuits 40 to 47 is sequentially written to corresponding eight memory cells in the memory cell array 10 in parallel, respectively. That is, the write data can be continuously written to the memory cell array 10 only by changing the addresses without need to input again the write data per write operation. The changed addresses are not limited to the column addresses, but the row addresses X0 to Xm can be changed.

As explained above, according to the present embodiment, the latch circuits 40 to 47 are provided on a plurality of signal paths, respectively, so as to write the write data to the memory cell array 10 in parallel. During the test operation, the write data can be supplied to these latch circuits 40 to 47 in series, respectively. It is thereby possible to greatly decrease the numbers of wirings and terminals necessary for the probe card. Therefore, even if the number of data input/output terminals is large, it is possible to secure a sufficient number of chips that can be tested in parallel. As a result, it is possible to reduce the operation test time per chip.

Furthermore, according to the present embodiment, the latch circuits 40 to 47 provided on the respective signal paths hold the write data, respectively. Due to this, even if the same test pattern is to be repeatedly written, there is no need to input again the write data per write operation. It is, therefore, possible to execute repeated write operations performed at the operation test at high speed.

The present invention can preferably apply to the semiconductor memory device, especially a DRAM.

Figure 6:
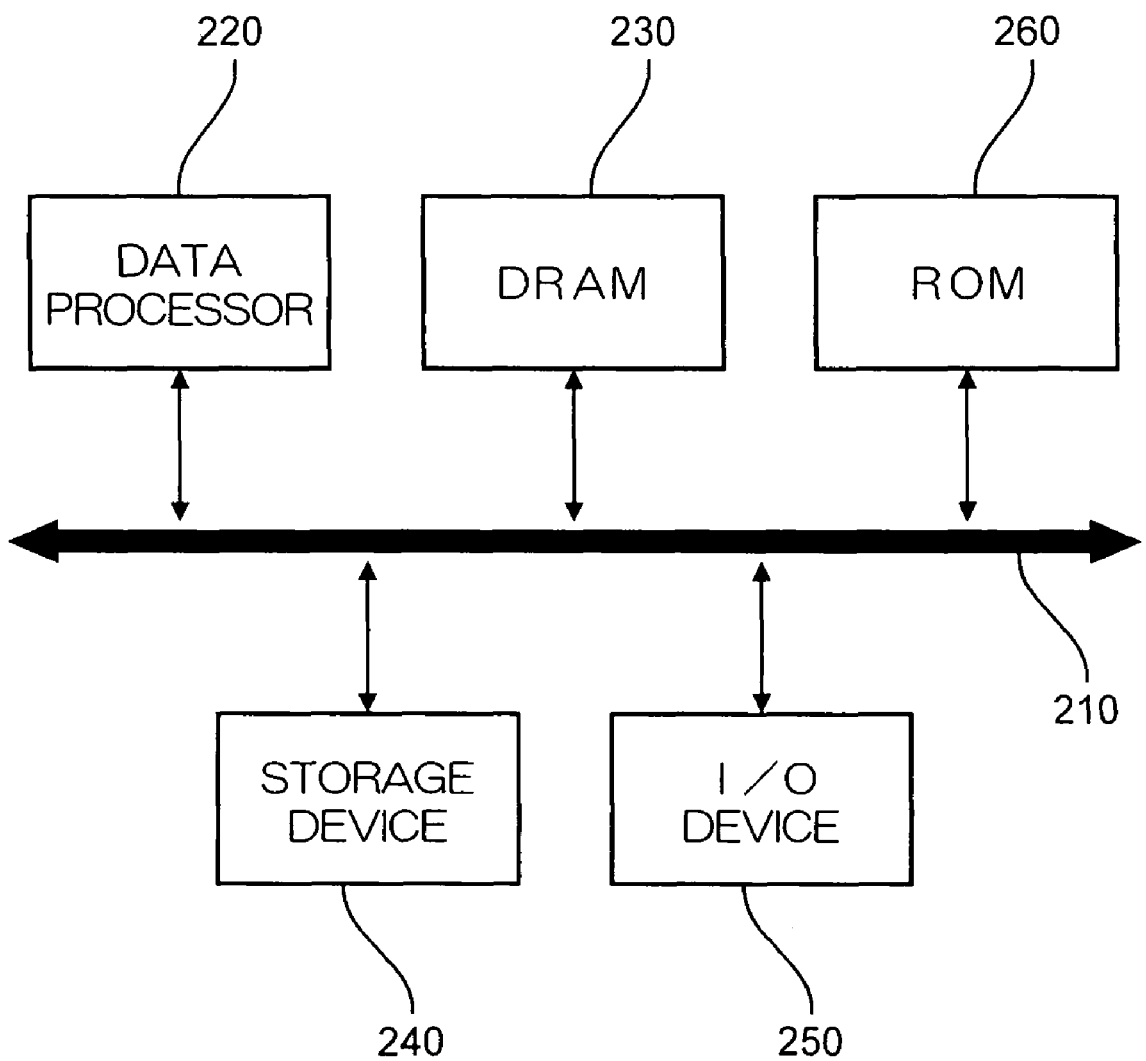
FIG. 6 is a block diagram showing a data processing system using the DRAM that the present invention is applied.

FIG. 6 is a block diagram showing a data processing system using the DRAM that the present invention is applied.

The data processing system 200 shown in FIG. 6 includes a data processor 220 and a DRAM 230 that the present invention is applied are connected to each other via a system bus 210. The data processor 220 can be selected from at least a microprocessor (MPU) and a digital signal processor (DSP). In FIG. 6, although the data processor 220 and the DRAM 230 are connected via the system bus 210 in order to simplify the diagram, they can be connected via not the system bus 210 but a local bus.

Further, in FIG. 6, although only one set of system bus 210 is employed in the data processing system 200 in order to simplify the diagram, a serial bus or a parallel bus connected to the system bus 210 via connectors can be provided. As shown in FIG. 6, a storage device 240, an I/O device 250, and a ROM 260 are connected to the system bus 210. However, they are not essential element for the data processing system 200.

The storage device 240 can be selected from at least a hard disk drive, an optical disk drive, and flash memory device. The I/O device 250 can be selected from a display device such as a liquid crystal display (LCD) and an input device such as a key board or a mouse. The I/O device 250 can consists of either input or output device. Further, although each one element is provided as shown in FIG. 6, two or more same elements can be provided in the data processing system.

The present invention is in no way limited to the aforementioned embodiments, but rather various modifications are possible within the scope of the invention as recited in the claims, and naturally these modifications are included within the scope of the invention.

For example, in the present embodiment, the test data terminal TDQ is provided separately from the data input/output terminals DQ0 to DQ7. However, it is not always essential to separately provide the data input/output terminals and the test data terminal. Alternatively, a part of the data input/output terminals can be employed as the test data terminal during the test operation.

Moreover, in the present embodiment, the unused column addresses are used as the selection signals. However, the selection signals are not limited to the unused column addresses. Accordingly, if a bit length of the row addresses is smaller than that of the column addresses, then unused row addresses can be used as the selection signals or the semiconductor memory device can be configured to be able to input the selection signals from a terminal other than the address terminals. In another alternative, the semiconductor memory device can be configured to be able to automatically generate selection signals internally.

As explained above, according to the present invention, the number of terminals on the probe card employed at the operation test can be decreased. Therefore, even if the number of data input/output terminals is large, it is possible to secure many chips that can be tested in parallel. This can eventually reduce the operation test time per chip and, therefore, reduce the manufacturing cost.

What is claimed is:

1. A semiconductor memory device comprising:
    a memory cell array;
    a plurality of data input/output terminals;
    a plurality of signal paths for writing data supplied to the plurality of data input/output terminals to the memory cell array in parallel;
    a plurality of latch circuits temporarily holding the data on the plurality of signal paths, respectively;
    a selector circuit selectively supplying test data to the plurality of latch circuits from a predetermined external terminal during a test operation; and
    a plurality of address terminals to which row addresses and column addresses different in address width are sequentially supplied, wherein the selector circuit selects one of the plurality of latch circuits during the test operation based on a selection signal unused during the normal operation,
    the selection signal being supplied via the plurality of address terminals which are not used to input the column addresses.

2. The semiconductor memory device as claimed in claim 1, wherein
    the selector circuit includes a plurality of first selector circuits provided on the plurality of signal paths, respectively, and connecting either the data input/output terminals corresponding to the first selector circuits or the predetermined external terminal to the signal paths corresponding to the first selector circuits, respectively.

3. A data processing system comprising a data processor and a semiconductor memory device, wherein the semiconductor memory device including:
    a memory cell array;
    a plurality of data input/output terminals;
    a plurality of signal paths for writing data supplied to the plurality of data input/output terminals to the memory cell array in parallel;
    a plurality of latch circuits temporarily holding the data on the plurality of signal paths, respectively;
    a selector circuit selectively supplying test data to the plurality of latch circuits from a predetermined external terminal during a test operation; and
    a plurality of address terminals to which row addresses and column addresses different in address width are sequentially supplied,
    wherein the selector circuit selects one of the plurality of latch circuits during the test operation based on a selection signal unused during the normal operation.

4. A semiconductor memory device comprising:
    a memory cell array;
    a plurality of data input/output terminals;
    a plurality of signal paths for writing data supplied to the plurality of data input/output terminals to the memory cell array in parallel;
    a plurality of latch circuits temporarily holding the data on the plurality of signal paths, respectively; and
    a plurality of selector circuits provided between the signal paths and the latch circuits, respectively, the selector circuits receiving test data in common to each other from a predetermined external terminal, and at least one of the selector circuits being selected to supply the test data to an associated one of the latch circuits during a test operation.

5. The semiconductor memory device as claimed in claim 4, wherein the predetermined external terminal differs from the plurality of data input/output terminals.

6. The semiconductor memory device as claimed in claim 4, wherein at least one of the selector circuits being selected to supply the test data to the associated one of the latch circuits during the test operation based on a selection signal unused during a normal operation.

* * * * *